Feb. 7, 1961 J. S. LINN 2,971,165

MULTI-PHASE OSCILLATOR WITH AMPLITUDE STABILIZING MEANS

Filed Sept. 12, 1958 2 Sheets-Sheet 1

INVENTOR:
Jerome S. Linn

By Smyth & Roston
Attorneys

Feb. 7, 1961 J. S. LINN 2,971,165

MULTI-PHASE OSCILLATOR WITH AMPLITUDE STABILIZING MEANS

Filed Sept. 12, 1958

2 Sheets-Sheet 2

INVENTOR:
Jerome S. Linn

By Smyth & Roston
Attorneys 2,971,165

MULTI-PHASE OSCILLATOR WITH AMPLITUDE STABILIZING MEANS

Jerome S. Linn, Los Angeles, Calif., assignor to Genisco, Inc., Los Angeles, Calif., a corporation of California Filed Sept. 12, 1958, Ser. No. 760,787
21 Claims. (Cl. 331—45)

Figure 1:
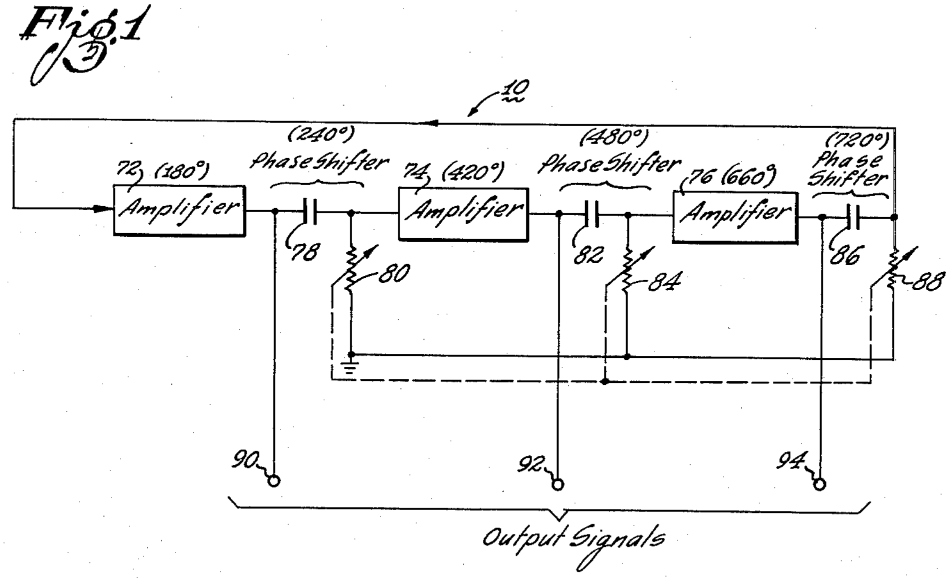

The present invention relates to circuits and systems for developing electrical energy, and it relates more particularly to a low-frequency multi-phase oscillator whose frequency can be adjusted through an extremely wide range down to a low value.

This application is a continuation-in-part of copending application Ser. No. 654,329, now U.S. Patent 2,898,412, which was filed April 22, 1958, in the name of the present inventor.

The oscillator of the present invention is of the resistance-capacitance phase-shift type. Difficulties have been encountered in the prior art, however, when it was attempted to construct such oscillators for the generation of multi-phase energy. Problems have arisen, for example, in the attempt to control the prior art oscillators of this general type so that each phase of the multi-phase output may be precisely maintained at the exact amplitude of all the other phases. This problem is aggravated in low-frequency low-amplitude oscillators in which the amplitudes of the generated signals of the different phases are dependent to a large extent upon tube characteristics, and the like.

The present invention provides in the embodiment to be described a simple and improved three-phase resistance-capacitance oscillator which includes a locking or stabilizing circuit. This stabilizing circuit functions to control each section of the oscillator to prevent any tendency for the signal amplitude of any phase of the multi-phase energy output to change relative to the signal amplitudes of the other phases. This control enables the oscillator of the invention to generate a multi-phase output signal which is composed of a plurality of signal components, with each component being held at precisely the same amplitude and each having a predetermined phase displacement with respect to one another. This composition of the multi-phase output signal is, of course, essential for the satisfactory multi-phase energizing of the utilizing equipment.

A further embodiment of the multi-phase oscillator invention to be described incorporates an adjustable frequency control which permits manual adjustment of the oscillator through a wide frequency range, and this latter embodiment also utilizes an automatic gain control circuit which is connected to the oscillator and which cooperates with the oscillator to maintain the desired amplitude and phase relationship between the components of the multi-phase output throughout the wide frequency range through which the oscillator may be adjusted.

The further embodiment of the invention to be described also includes an improved cascode output circuit which is connected to the oscillator in an improved manner to permit direct coupling of the multi-phase output to the utilizing circuit, the output circuit providing a balanced multi-phase output even at low signal levels and low frequency, with the outputs being independent of changes in tube characteristics and other circuit parameters.

Figure 2:
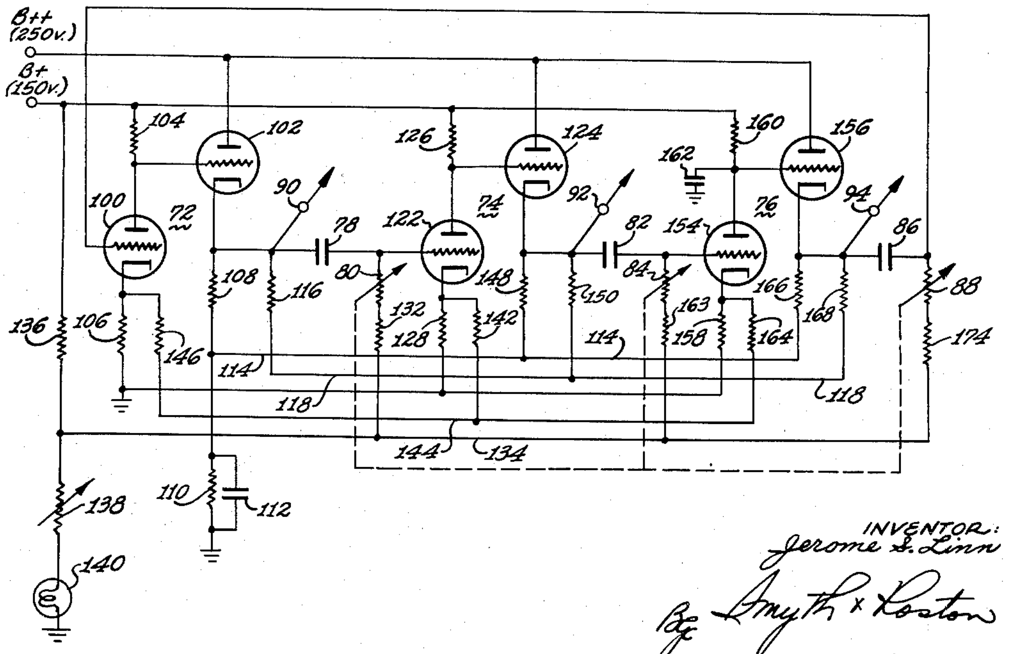
Figure 3:
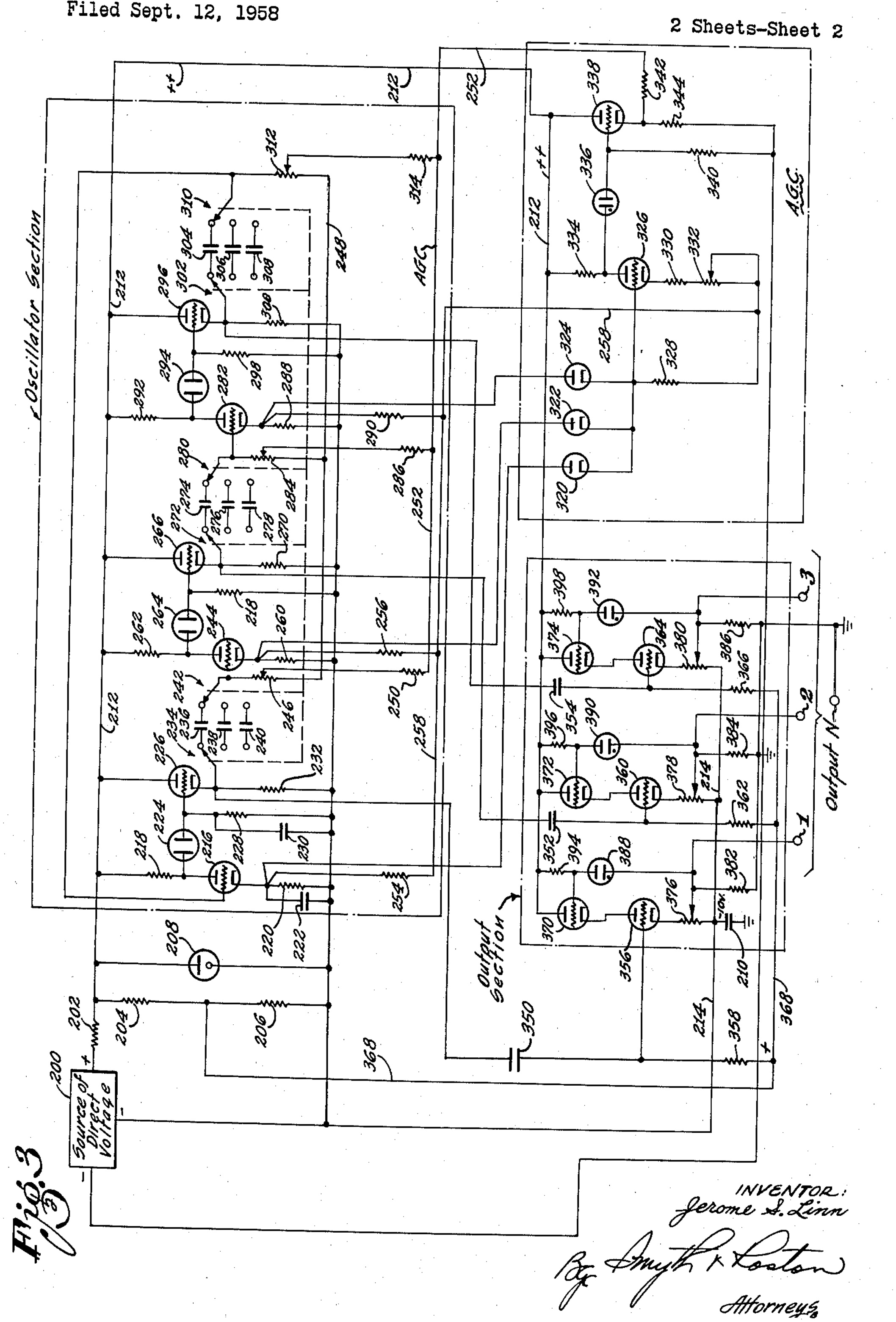

Other features of the system of the invention will become apparent from a consideration of the following description of several embodiments of the invention, and when the following description is taken in conjunction with the accompanying drawings, in which:

Figure 1 is a diagram, partially in block form and partially schematic, indicating a three-phase electronic phase-shift oscillator incorporating principles of the present invention;

Figure 2 is a circuit diagram of a three-phase variable frequency electronic phase-shift oscillator embodying the principles of the system in Figure 1, and which oscillator incorporates a locking or stabilizing circuit to sustain equal amplitudes in each phase of the three-phase output signal from the oscillator so as to maintain optimum operation at any particular frequency to which the oscillator may be adjusted; and Figure 3 is a circuit diagram of a further embodiment of the invention, the further embodiment being adjustable through each of three distinct frequency bands in a wide frequency range; that embodiment incorporating an automatic gain control circuit to maintain the proper relationship between the multi-phase outputs at any of the selected frequencies, the latter embodiment also including a cascode-connected output circuit for permitting direct coupling to a utilization means and which maintains the desired balance between the different components of the multi-phase output.

The oscillator of Figure 1 includes a first amplifier 72, a second amplifier 74, and a third amplifier 76, these amplifiers being connected in cascade and constituting a capacitance-coupled three-stage amplifying system.

A first phase-shifting network is interposed between the amplifiers 72 and 74. This phase-shifting network includes a series capacitor 78 and a variable resistor 80, the variable resistor being connected between the input terminal of the amplifier 74 and ground. A second phase-shifting network is interposed between the amplifiers 74 and 76. This second phase-shifting network includes a series capacitor 82 and a variable resistor 84. The resistor 84 is connected between the input terminal of the amplifier 76 and ground. Finally, a third phase-shifting network is interposed between the output terminal of the amplifier 76 and the input terminal of the amplifier 72. This latter phase-shifting network includes a series capacitor 86 and a grounded variable resistor 88, the resistor being connected to the input terminal of the amplifier 72.

A first oscillator output terminal 90 is connected to the output terminal of the amplifier 72, a second oscillator output terminal 92 is connected to the output terminal of the amplifier 74, and a third oscillator output terminal 94 is connected to the output terminal of the amplifier 76.

Assume that each of the amplifiers 72, 74 and 76 is a single-stage type, and that each produces the usual 180° phase-shift to the signals translated through it. Also, assume that each of the phase-shifting networks 78, 80, 82, 84, 86 and 88 produces a 60° phase-shift at the frequency to which the oscillator is adjusted. Then, oscillation will be sustained at that frequency in the closed loop system of Figure 1. This obtains because the output signal from the amplifier 76, after passing through the phase-shifting network 86 and 88 at that particular frequency is phase-shifted by 720° with respect to the input signal to the amplifier 72 and is, therefore, in phase with that input signal and of the proper phase to sustain oscillation in the system.

The three resistors 80, 84 and 88 are mechanically intercoupled for unicontrol. The simultaneous control of the three resistors 80, 84 and 88 controls the frequency of the oscillator in accordance with known phase-shift resistance-capacity oscillator principles. There are produced across the output terminals 90, 92 and 94, therefore, three output signals which are mutually displaced by 120° to constitute a usual three-phase output. The frequency of this three-phase output may be conveniently adjusted by adjusting the values of the resistors 80, 84 and 88 in unison. Such adjustment, in accordance with known phase-shift principles changes the frequency at which the three phase-shifting networks produce signals of the proper phase to sustain oscillation in the system.

In oscillators of the type described above, difficulties have been encountered in precisely maintaining each of the three signals at the output terminals 90, 92 and 94 at precisely the same amplitude in the presence of parameter changes in the system. It is essential, as previously pointed out, that such equal amplitude relation be maintained for proper three-phase operation of the instrumentality using the three-phase energy from the system. The oscillator of the present invention, as illustrated in Figure 2, incorporates a stabilizing or locking network, which will be described, and this network serves to hold the three phases of the oscillator output energy at precisely equal amplitudes for proper three-phase operation.

The oscillator of Figure 2 includes an electron discharge tube 100 which is preferably a triode and which, together with a second triode 102, are connected to constitute the amplifier 72 of Figure 1. A resistor 104, which may have a value of 5.1 kilo-ohms, is connected between the anode of the tube 100 and the positive terminal of a source of direct-current exciting potential and which may have a value of 150 volts. This terminal is designated as B+. A resistor 106, which may have the value of 2.2 kilo-ohms, is connected to the cathode of the tube 100 and to a point of reference potential or ground.

The tube 102 is connected as a cathode follower, and its anode is directly connected to the positive terminal B++ of a second source of direct-current exciting potential. This latter source may, for example, have a value of 250 volts. The anode of the tube 100 is directly connected to the control grid of the tube 102. The cathode of the tube 102 is connected to one terminal of a resistor 108 having a value of 4.7 kilo-ohms. The other terminal of the resistor 108 is connected to the ungrounded side of a grounded resistor 110. This latter resistor may have a value of 5.1 kilo-ohms, and it is shunted by a capacitor 112. A common connecting lead 114 is connected to the common junction of the resistors 108 and 110.

The oscillator output terminal 90 is connected directly to the cathode of the tube 102. A balancing resistor 116 is connected to the cathode of the tube 102 and to a common connecting lead 118.

The series capacitor 78 of the first phase-shifting network is connected between the cathode of the tube 102 and the control grid of an electron discharge tube 122. This capacitor may have a value of 1 microfarad. The latter tube, together with an electron discharge tube 124, constitute the second amplifier 74 of Figure 1. Both these tubes may be triodes, as illustrated.

A resistor 126 which may have a value of 5.1 kilo-ohms, connects the anode of the tube 122 to the positive terminal B+. A resistor 128, which may have a value of 2.2 kilo-ohms, is connected between the cathode of the tube 122 and ground.

The control grid of the tube 122 is connected to one terminal of the variable resistor 80 of the first phase-shifting network. This resistor may have a maximum resistance of 500 kilo-ohms. A resistor 132 is connected between the other terminal of the variable resistor 80 and a common connecting lead 134, this latter resistor having a resistance of 30 kilo-ohms. The lead 134 is connected to the common junction of a pair of resistors 136 and 138. These resistors 136 and 138, together with a 6-watt 110-volt ballast tube 140, are connected in series between the positive terminal B+ and ground. The resistor 136 may have a value of 22 kilo-ohms, and the resistor 138 is variable and may have a maximum value of 600 kilo-ohms. These resistors form a voltage divider across the 150 volt source of direct-current exciting potential, and they function to establish a stabilized positive voltage of, for example, +8.5 volts on the lead 134. This voltage functions to provide a slight positive bias for the control grids of the tubes making up the amplifiers of the system.

The anode of the tube 122 is directly connected to the control grid of the tube 124, and a resistor 142 connects the cathode of the tube 122 to a common lead 144. A resistor 146 connects the cathode of the tube 100 to this common lead, and the resistors 142 and 146 may each have a value of 18 kilo-ohms.

The tube 124 is connected as a cathode follower, and its anode is directly connected to the positive terminal B++. A resistor 148 is connected between the cathode of the tube 124 and the common lead 114, and this resistor may have a value of 4.7 kilo-ohms. The output terminal 92 is connected to the cathode of the tube 124, and this cathode is connected to a resistor 150 which, in turn, is connected to the common lead 118. The resistor 150 may have a value of 10 kilo-ohms.

The cathode of the tube 124 is further connected to one side of the capacitor 82 in the second phase-shifting network which has, for example, a value of 1 microfarad. The other side of the capacitor 82 is connected to the control grid of an electron discharge tube 154. The variable resistor 84 of the second phase-shifting network and a resistor 163 are connected between the control grid of the tube 154 and the lead 134. The resistor 84 may have a maximum resistance of 500 kilo-ohms, and the resistor 163 may have a resistance of 30 kilo-ohms. The tube 154, together with an electron discharge tube 156 constitutes the amplifier 76, and these tubes may be triodes. A resistor 158 is connected to the cathode of the tube 154 and to ground, and this resistor may have a value of 2.2 kilo-ohms.

The anode of the tube 154 is connected to one terminal of a resistor 160, the other terminal of this resistor being connected to the positive terminal B+. The resistor 160 has a value of 5.1 kilo-ohms, for example. A capacitor 162 is connected between the anode of the tube 154 and ground. This later capacitor may be connected between the anodes of any of the tubes 100, 122 and 154 and ground, and it serves to by-pass high frequency parasitic signals. It has, for example, a value of 330 micromicrofarads. A resistor 164 is connected from the cathode of the tube 154 to the common lead 144, and this resistor may have a value of 18 kilo-ohms.

The anode of the tube 154 is directly connected to the control grid of the tube 156. The tube 156 also is connected to the positive terminal B++. The output terminal 94 is connected to the cathode of the tube 156. The cathode of the tube 156 is also connected to a resistor 166 of, for example, 4.7 kilo-ohms, and this resistor is connected to the common lead 114. In like manner, a resistor 168 of, for example, 10 kilo-ohms is connected between the cathode of the tube 156 and the common lead 118.

The capacitor 86 of the third phase-shifting network is connected between the cathode of the tube 156 and the control grid of the tube 100. This capacitor may, for example, have a capacity of 1 microfarad. The variable resistor 88 and a resistor 174 are connected in series between the control grid of the tube 100 and the common lead 134. The resistor 88 may have a maximum value of 500 kilo-ohms, and the resistor 174 may have a value of 30 kilo-ohms.

The resistors 104, 126 and 160 respectively connected to the anodes of the tubes 100, 122 and 154 are made sufficiently large, as are the resistors 106, 128 and 158 respectively connected to the cathodes of these tubes, so that the tubes exhibit just enough amplification to sustain oscillation in the system. The values of these resistors with respect to the internal impedance of the tubes themselves is sufficiently large so that variations in the tube characteristics have no material effect on the overall characteristics of the oscillator system or on the amplitude of the output signals. The tubes 100, 122 and 154 are so heavily degenerative because of their cathode resistors that their respective grids are returned to a positive potential point, rather than to ground in order that the tubes may be operated at their proper operating points. This positive potential point is constituted by the lead 134 which, as noted above, is established at an adjustable positive voltage by the resistors 136 and 138. This positive voltage may be of the order of 8.5 volts (as previously noted), and it is controllable by varying the resistor 138.

Due to the fact that the anodes of the tubes 100, 122 and 154 are directly coupled to the control grids of their corresponding cathode follower tubes 102, 124 and 156, the cathodes of the cathode follower tubes must be established at a positive potential so that their control grids may be negative with respect thereto for proper operation of the cathode followers. This positive potential is provided by the network of the resistor 110 and its shunting capacitor 112. This network responds to the direct-current flow through the tubes 102, 124 and 156 to establish a positive direct voltage of the order of 100 volts on the common lead 114. This positive voltage provides the correct operating voltage for the cathode follower tubes. These cathode followers provide in usual manner an appropriate coupling between the amplifier tubes and the respective output terminals 90, 92 and 94, and they enable the oscillator to feed to a low impedance load without unduly loading any of the oscillator tubes 100, 122 and 154.

The three signal components developed at the output terminals 90, 92 and 94 are of the same amplitude and are mutually displaced by 120° for usual three-phase operation. These signals, therefore, at any instant effectively add to zero across the resistor-capacity network 110 and 112. Therefore, no unwanted feed back effects are caused by this network. This also applies to the resistor 138 and ballast tube 140, across which all three signal components are impressed.

In the system of Figure 2, provisions are made to hold the signals at the output terminals 90, 92 and 94 precisely at the same amplitude with respect to one another, which equal amplitudes are essential for proper three-phase operation. This is achieved by the resistors 116, 150 and 168 which connect the cathodes of the tubes 102, 124 and 156 to the common lead 118; and also by the resistors 146, 142 and 164 which connect the cathodes of the tubes 100, 122 and 154 to the common lead 144. These two groups of resistors respectively constitute a Y connected three-phase balancing load for the three tubes 100, 122 and 154; and a Y connected three-phase balancing load for the three tubes 102, 124 and 156. Any tendency for the amplitude of the signal component at the cathode of any one of these tubes to change with respect to the amplitudes of the signal components at the cathodes of the other tubes in its group, sets up balancing currents in the corresponding Y connected balancing load which tend to equalize these amplitudes.

For example, should the signal component at the output terminal 90 tend to increase in amplitude, the resulting current flow through the resistors 150 and 168 is in a direction to increase the cathode voltage of the tubes 124 and 156. This tends to increase the amplitude of the signal components at the output terminals 92 and 94, and it tends to decrease the amplitude of the signal component at the terminal 90, until an equal-amplitude condition again is reached.

In a similar manner, the balancing load formed by the resistors 146, 142 and 164 functions to control the cathode biases on the tubes 100, 122 and 154. These resistors tend to maintain the signals amplified by these tubes at the same relative amplitude despite changes in the parameters of the tubes and their associated circuits.

Therefore, the amplitudes of the three-signal components of the three-phase energy developed by the system of Figure 2 are precisely held at essentially equal amplitudes by the inherent nature of the circuit. Therefore, although the signals developed at the output terminals 90, 92 and 94 are essentially independent of one another, they are held precisely at the proper amplitude and phase relation for the correct three-phase operation of the oscillator. Therefore, the oscillator develops at the terminal 90 an output signal component that may be represented by $E \sin wt$; it develops at the output terminal 92 an output signal component which may be represented by $E \sin (wt+120°)$; and it develops at the output terminal 94 an output signal component which may be represented by $E \sin (wt-120°)$. As described above, these three output signal components are precisely held in this phase and amplitude relationship for appropriate three-phase operation.

The embodiment of the invention shown in Figure 3 includes a source of direct voltage 200 which has positive terminal, a negative terminal and a common, or intermediate negative, terminal. A group of three resistors 202, 204 and 206 are connected in series between the positive and common terminals of the source 200. The resistor 202 has a resistance of 2.5 kilo-ohms, the resistor 204 has a resistance of 33 kilo-ohms, and the resistor 206 has a resistance of 13 kilo-ohms. A known type of voltage stabilizing tube 208 is shunted across the resistors 204 and 206. The common terminal of the source 200 is connected to a grounded capacitor 210 which has a capacity of 200 microfarads. A lead 212 is connected to the junction of the resistors 202 and 204, and a lead 214 is connected to the common terminal of the voltage source.

A triode 216 has its anode connected to a 5.6 kilo-ohm resistor 218, which, in turn, connects with the lead 212. The cathode of the diode 216 is connected to a 3.9 kilo-ohm resistor 220 which is shunted by a capacitor 222. The resistor 220 and the capacitor 222 are both connected to the common lead 214. The capacitor 222 has a capacity of .0068 microfarad approximately.

The anode of the triode 216 is connected to a neon tube 224 which, in turn, connects with the control grid of a cathode follower triode 226. The latter control grid is connected to a 100 kilo-ohm resistor 228 which is shunted by a capacitor 230. The capacitor 230 has a capacity of the order of 150 micromicrofarads and its function is to eliminate parasitic oscillations. Thus the resistor 228 and the capacitor 230 are connected to the common lead 214. The neon tube serves as a suitable direct current coupling between the anode of the triode 216 and the control grid of the triode 226, this tube providing a desired voltage drop of the order, for example, of 85 volts.

The anode of the triode 226 is connected to the common lead 212, and its cathode connects with a 10 kilo-ohm resistor 232. This resistor is connected to the common lead 214. The triode 226 is connected as a cathode follower, and its cathode connects with the armature of a triple-contact band-change switch 234. The switch 234 has three fixed contacts, each of which is connected to a different one of three capacitors 236, 238 and 240. These capacitors, and other similar capacitors to be described, serve to condition the oscillator for operation in one frequency band or another. The capacitor 236 has a capacity of 1 microfarad, the capacitor 238 has a capacity of .1 microfarad, and the capacitor 240 has a capacity of .01 microfarad. These capacitors are also connected respectively to the fixed contacts of a three-contact band-change switch 242. The armature of the latter switch is connected to the control grid of a triode 244. This control grid is connected to a 100 kilo-ohm potentiometer 246 which, in turn, connects with a common lead 248. The armature of the potentiometer 246 is connected to a resistor 250 of 8.2 kilo-ohms, and the resistor is connected to a common lead 252.

The cathode of the triode 244 and the cathode of the triode 216 are connected to a pair of 3.3 kilo-ohm resistors 254 and 256 respectively, and these resistors connect with a common lead 258. The cathode of the triode 244 is also connected to a 3.9 kilo-ohm resistor 260 which is connected to the common lead 214.

The anode of the triode 244 is connected to a 5.6 kilo-ohm resistor 262, and this resistor connects with the common lead 212. The anode of the triode 244 is also connected to a direct-current coupling neon tube 264 which, in turn, connects with the control grid of a cathode follower triode 266. The latter control grid is connected to a 100 kilo-ohm resistor 268, and the resistor is connected to the common lead 214. The anode of the triode 266 is connected to the common lead 212, and a 10 kilo-ohm resistor 270 is interposed between its cathode and the common lead 214.

The cathode of the triode 266 connects with the armature of a three-contact band-change switch 272, and the fixed contacts of the switch are connected respectively to three capacitors 274, 276 and 278. The capacitor 274 has a capacity of 1 microfarad, the capacitor 276 has a capacity of .1 microfarad, and the capacitor 278 has a capacity of .01 microfarad. These capacitors are also respectively connected to the fixed contacts of a three-contact band-change switch 280. The armature of the latter switch is connected to the control grid of a triode 282, the control grid being connected to a potentiometer 284 of 100 kilo-ohms. The potentiometer 284 connects with the common lead 248, and its armature is connected to an 8.2 kilo-ohm resistor, the resistor being connected to the common lead 252.

The cathode of the triode 282 is connected to a resistor 288 of 3.9 kilo-ohms, and this resistor connects with the common lead 214. The cathode of the triode 282 is also connected to a 3.3 kilo-ohm resistor 290, the latter resistor being connected to the common lead 258.

The anode of the triode 282 connects with a 5.6 kilo-ohm resistor 292 and with a direct-current coupling neon tube 294. The neon tube is connected to the control grid of a cathode follower triode 296, the control grid being connected to a 100 kilo-ohm resistor 298. The resistor 298 is connected to the common lead 214. The cathode of the triode 296 is connected to a 10 kilo-ohm resistor 300, the latter resistor also being connected to the common lead 214. The anode of the triode 296 is connected back to the common lead 212.

The cathode of the triode 296 is connected to the armature of a three-contact band-change switch 302. The three fixed contacts of the switch 302 are connected respectively to three capacitors 304, 306 and 308. The capacitor 304 has a capacity of 1 microfarad, the capacitor 306 has a capacity of .1 microfarad, and the capacitor 308 has a capacity of .01 microfarad. These capacitors are also connected to the respective fixed contacts of a three-contact band-change switch 310. The armature of the switch 310, and the armatures of the switches 234, 242, 272, 280 and 302 may be mechanically intercoupled with one another for unicontrol. The armature of the switch 310 is connected back to the control grid of the triode 216, and it is also connected to a 100 kilo-ohm potentiometer 312. This potentiometer is connected to the common lead 248, and its armature is connected to a resistor 314. The resistor 314 has a resistance of 8.2 kilo-ohms, and it is connected to the common lead 252.

The cathodes of the triode 216, 244 and 282 are connected to the anodes of respective diodes 320, 322 and 324 which are included in the automatic gain control (AGC) circuit now to be described. The cathodes of these diodes are connected together and to the control grid of a triode 326, this control grid being connected to a 1 megohm resistor 328 which is connected back to the common lead 258. The cathode of the triode 326 is connected to a 10 kilo-ohm resistor 330, and this resistor is connected to a 20-kilo-ohm potentiometer 332. The other terminal of the potentiometer, and its armature, are both connected to the lead 258.

The anode of the triode 326 is connected to a resistor 334, the resistor having a resistance of 270 kilo-ohms and being connected to the lead 212. The anode of the triode 326 is also connected to a direct-current coupling neon tube 336, the neon tube being connected to the control grid of a cathode follower triode 338. The latter control grid is connected to a 1 megohm resistor 340, this resistor being connected to the negative terminal of the source of direct voltage 200. The anode of the triode 338 is connected directly to the common lead 212, and the cathode of this triode is connected to the junction of a 1 megohm resistor 342 and a 220 kilo-ohm resistor 344. The resistor 342 is connected to the lead 252, and the resistor 344 is connected to the negative terminal of the source 200.

The cathodes of the triodes 226, 266 and 296 are connected to three coupling capacitors 350, 352 and 354 respectively. Each of these coupling capacitors has a capacity of 2 microfarads. The capacitor 350 is connected to the control grid of a triode 356 and to a resistor 358. The capacitor 352 is connected to the control grid of a triode 360 and to a resistor 362. The capacitor 354 is connected to the control grid of a triode 364 and to a resistor 366. The resistors 358, 362 and 366 each has a resistance of 220 kilo-ohms, and all are connected to a common lead 368. This latter common lead is connected to the junction of the resistors 204 and 206, and it is established at a positive direct voltage which is less than the positive direct voltage of the lead 212.

The anode of the triode 356 is connected to the cathode of a triode 370, the anode of the triode 260 is connected to the cathode of a triode 372, and the anode of the triode 364 is connected to the cathode of a triode 374, the anodes of the triodes 370, 372 and 374 are all connected to the common lead 212.

The cathode of the triode 356 is connected to a 10 kilo-ohm potentiometer 376 which is connected to the common lead 214. Likewise, the cathode of the triode 360 connects with a 10 kilo-ohm potentiometer 378, and the cathode of the triode 364 connects with a 10 kilo-ohm potentiometer 380. Both these latter potentiometers are also connected to the common lead 214. The armatures of the potentiometers 376, 378 and 380 are connected to respective ones of three 10 kilo-ohm grounded resistors 382, 384, and 386; and these armatures are also connected to three output terminals designated 1, 2, and 3 respectively. The grounded neutral output terminal of the system is designated N.

A direct-current coupling neon tube 388 is interposed between the control grid of the triode 370 and the armature of the potentiometer 376. Likewise, a pair of direct-current coupling neon tubes 390 and 392 are respectively interposed between the control grids of the triodes 372 and 374 and the armatures of the potentiometers 378 and 380. Finally, a group of three 470 kilo-ohm resistors are respectively connected to the control grids of the triodes 370, 372 and 374 and the common lead 212, these resistors being designated 394, 396 and 398.

In the embodiment of Figure 3, the three resistors 254, 256 and 290 which are connected to the lead 258 perform the same stabilizing function as the resistors 146, 142 and 164 in the embodiment of Figure 2. That is, the resistors 254, 256 and 290 form a Y-connected three-phase balancing load for the three triodes 216, 244 and 282. Therefore, any tendency for the amplitude of the signal component at the cathode of any of these three triodes to change with respect to the amplitude of the other two signal components at the respective cathodes of the other two triodes sets up, in the described manner, balancing currents in the balancing load which tend to maintain the signal components at the same amplitude.

The capacitors 236, 238, 240; 274, 276, 278; and 304, 306 and 308 and their associated switches 234, 242, 272, 280, 302 and 204 permit the circuit to be switched to any selected one of three frequency bands. These frequency bands may be, for example, 1 c.p.s.–10 c.p.s., 10 c.p.s.–100 c.p.s., and 100 c.p.s.–1000 c.p.s. The switches, as noted above, are ganged together for unicontrol. Frequency settings within a selected frequency band are provided by the manual adjustment of the potentiometers 246, 284 and 312. The armatures of these potentiometers may also be ganged together for unicontrol.

The resistor 328 in the automatic gain control (AGC) circuit is connected to the common lead 258 and through the respective diodes 320, 322 and 324 to the cathodes of the triodes 216, 244 and 282. The resistor 328, therefore, forms a summing network and the sum of the positive half cycles of the three three-phase signals appears across this resistor. This sum is a direct voltage which is equal to the average amplitude of the three-phase energy.

The direct voltage across the resistor 328 is introduced to the control grid of the triode 326 which is connected as a direct current amplifier. The resulting amplified direct current is coupled through the neon tube 336 to the control grid of the cathode follower triode 338. The cathode resistor 344 of the cathode follower triode 338 is returned to the negative terminal of the direct voltage source 200 so that the resulting AGC voltage which appears across the resistor 344 may be negative with respect to the cathodes of the controlled triodes 216, 244 and 282.

As noted above, the automatic gain control circuit provides for a stable gain characteristic in the circuitry throughout the wide frequency range. This frequency range may extend, as noted above, from 1 c.p.s. to 1000 c.p.s. and through three distinct frequency bands depending upon the setting of the switches 234, 242, 272, 280, 302 and 310.

The three triodes 356, 360 and 364 in the output section of the system of Figure 3 are connected as cathode followers. The triodes 370, 372 and 374 and their respective neon coupling tubes 388, 390 and 392 form positive feed-back circuits for the cathode followers.

The function of the positive feed-back circuits is to maintain the three-phase output signals at the output terminals 1, 2 and 3 balanced with respect to the grounded neutral terminal despite any changes in tube characteristics. Unbalance due to changes in tube characteristics is most pronounced at the low signal levels.

As noted above, the three triodes 370, 372 and 374, and associated circuitry, form positive feed-back circuits for corresponding ones of the cathode follower circuits of the triodes 356, 360 and 364. This increases the gain of the cathode follower circuits and, concomitantly, the fidelity of the cathode followers.

The output amplifier is, in the described manner, thereby constructed so that changes in tube characteristics have little effect on the three phase output energy, and such changes have no tendency to produce unbalance in this output energy, especially at the low signal levels.

It will be noted that the common terminal of the source of direct voltage 200 is not connected directly to ground. Instead the direct current ground connection is established at the armatures of the potentiometers 376, 378 and 380 and through the respective resistors 382, 384 and 386. This enables the three-phase output signals between the output terminals 1, 2 and 3 to swing negative with respect to the grounded neutral terminal N which is desired for proper three-phase operation.

The invention provides, therefore, an improved system and apparatus for producing highly stabilized three-phase output energy. The apparatus of the invention is adjustable through a wide frequency range, and it is constructed to provide a highly stabilized, balanced three-phase output which remains balanced throughout the frequency range and which is independent of changes in tube characteristics and circuit parameters.

I claim:

1. A system for producing multi-phase output energy including: a plurality of amplifier stages; a corresponding plurality of electron discharge tubes respectively included in said amplifier stages; each of said tubes including an anode, a cathode and a control grid; a corresponding plurality of phase-shifting networks respectively coupled to corresponding ones of the amplifier stages, each of said phase-shifting networks being connected between the anode of the discharge tube in a corresponding one of the amplifier stages and the control grid of the discharge tube in another of the amplifier stages; and a corresponding plurality of resistors respectively connected between the cathodes of said tubes and a common floating potential point to form a balancing network for the multi-phase output energy.

2. An oscillatory system for producing three-phase output energy including: a first amplifier stage including a first electron discharge tube having a cathode, a control grid and an anode; a second amplifier stage including a second electron discharge tube having a cathode, a control grid and an anode; a third amplifier stage including a third electron discharge tube having a cathode, a control grid and an anode; a first phase-shifting network interposed between the anode of the first discharge tube and the control grid of the second discharge tube; a second phase-shifting network interposed between the anode of the second discharge tube and the control grid of the third discharge tube; a third phase-shifting network interposed between the anode of the third discharge tube and the control grid of the first discharge tube; and first, second and third resistors respectively connected between the cathodes of the first, second and third discharge tubes and a common floating potential point.

3. An oscillator for a three-phase generating system including: a first amplifier stage serving to shift signals amplified thereby through 180 degrees and including an electron discharge tube having a first cathode; a second amplifier stage serving to shift signals amplified thereby through 180 degrees and including a second discharge tube having a second cathode; a first phase-shifting network interposed between said first and second amplifier stages for shifting signals through 60 degrees; a third amplifier stage serving to shift signals amplified thereby through 180 degrees and including an electron discharge tube having a third cathode; a second phase-shifting network interposed between said second and third amplifier stages for shifting signals through 60 degrees; and third phase-shifting network interposed between said third and first amplifier stages for shifting signals through 60 degrees; first and second and third resistor means for respectively connecting said first and second and third cathodes to a point of reference potential, and first and second and third resistors respectively connected to said first and second and third cathodes and to a common floating potential point.

4. An oscillatory system for producing three-phase output energy including: a first amplifier stage including a first electron discharge tube having a cathode, a control grid and an anode; a second amplifier stage including a second electron discharge tube having a cathode, a control grid and an anode; a third amplifier stage including a third electron discharge tube having a cathode, a control grid and an anode; a first resistance-capacitance phase-shifting network interposed between the anode of the first discharge tube and the control grid of the second discharge tube and including a plurality of capacitors; first switching means for selectively connecting the capacitors into the circuit of the first phase-shifting network; a second resistance-capacitance phase-shifting network interposed between the anode of the second discharge tube and the control grid of the third discharge tube and including a second plurality of capacitors; second switching means for selectively connecting the capacitors of the second plurality into the circuit of the second phase-shifting network; a third phase-shifting network interposed between the anode of the third discharge tube and the control grid of the first discharge tube and including a third plurality of capacitors; third switching means for selectively connecting the capacitors of the third plurality into the circuit of the third phase-shifting network; and first, second and third resistors respectively connected to the cathodes of the first, second and third discharge tubes and to a common floating potential point.

5. An oscillatory system for producing three-phase output energy including: a first amplifier stage including a first electron discharge tube having a cathode, a control grid and an anode; a second amplifier stage including a second electron discharge tube having a cathode, a control grid and an anode; a third amplifier stage including a third electron discharge tube having a cathode, a control grid and an anode; a first resistance-capacitance phase-shifting network interposed between the anode of the first discharge tube and the control grid of the second discharge tube and including first variable resistance means connected to a common connecting point; a second resistance-capacitance phase-shifting network interposed between the anode of the second discharge and the control grid of the third discharge tube and including second variable resistance means connected between the control grid of the third discharge tube and said common connecting point; a third resistance-capacitance phase-shifting network means interposed between the anode of the third discharge tube and the control grid of the first discharge tube and including third variable resistor means connected between the control grid of the first discharge tube and the common connecting point; and first, second and third resistors respectively connected to the cathodes of the first, second and third discharge tubes and to a common floating potential point.

6. The combination defined in claim 5 and which includes means for establishing said common connecting point at a predetermined fixed potential.

7. The combination defined in claim 5 and which includes automatic gain control means for establishing said common connecting point at a controlled potential.

8. An oscillatory system for producing three-phase output energy including: a first amplifier stage including a first electron discharge tube having a cathode, a control grid and an anode; a second amplifier stage including a second electron discharge tube having a cathode, a control grid and anode; a third amplifier stage including a third electron discharge tube having a cathode, a control grid and an anode; first, second and third cathode follower stages respectively coupled to the anodes of the first, second and third electron discharge tubes; a first resistance-capacitance phase-shifting network connected to the first cathode follower stage and to the control grid of the second discharge tube, said first resistance-capacitance network including potentiometer means connected to the control grid of the second discharge tube and to a common connecting point; a second resistance-capacitance phase-shifting network connected to the second cathode follower stage and to the control grid of the third discharge tube, said second resistance-capacitance network including a potentiometer connected to the control grid of the third discharge tube and to said common connecting point; a third resistance-capacitance phase-shifting network connected to the third cathode follower stage and to the control grid of said first electron discharge tube, said third resistance-capacitance network including potentiometer means connected to said control grid of the third discharge tube and to said common connecting point; said first, second and third potentiometer means each including an armature; automatic gain control means connected to the armatures of said potentiometer means for establishing said armatures at a controlled potential; and first, second and third resistors respectively connected between the cathodes of the first, second and third discharge tubes and a common floating potential point.

9. The combination defined in claim 8 in which said automatic gain control means includes a plurality of diodes respectively connected to the cathodes of respective ones of said discharge tubes, and a resistance means connected to said diodes and to said common floating potential point.

10. An oscillatory system for producing three-phase output energy including: a first amplifier stage including a first electron discharge tube having a cathode, a control grid and an anode; a second amplifier stage including a second electron discharge tube having a cathode, a control grid and an anode; a third amplifier stage including a third electron discharge tube having a cathode, a control grid and an anode; a first plurality of resistance means respectively connecting the anodes of said first, second and third discharge tubes to the positive terminal of a source of direct voltage; a second plurality of resistance means respectively connecting the cathodes of said first, second and third discharge tubes to the negative terminal of the source; first, second and third cathode follower stages each including an electron discharge tube having an anode connected to the positive terminal of the source and each having a control grid and a cathode; a plurality of resistance-capacitance phase-shifting networks respectively interposed between the cathodes of the discharge tubes in the cathode follower stages and the control grids of corresponding ones of the first, second and third discharge tubes, each of said phase-shifting networks including a potentiometer interposed between the control grid of the corresponding one of said first, second and third discharge tubes and a common connecting point and having an armature; a plurality of resistance means respectively interposed between the cathodes of the cathode follower discharge tubes and the negative terminal of the source; a plurality of direct-current coupling networks respectively interposed between the anodes of the first, second and third discharge tubes and the control grids of corresponding ones of the cathode follower discharge tubes; automatic gain control means connected to the armatures of said potentiometer means for establishing said armatures at a controlled potential; a plurality of resistance means respectively interposed between the cathodes of the first, second and third discharge tubes and the negative terminal of said source; and a further plurality of resistors respectively connected to the cathodes of the first, second and third discharge tubes and to a common floating potential point.

11. The combination defined in claim 10 in which said automatic gain control means includes a plurality of diodes having respective anodes connected to the cathodes of respective ones of the first, second and third discharge tubes, and each of said diodes having a cathode; and common resistance means interposed between the cathodes of said diodes and said common floating potential point.

12. The combination defined in claim 10 in which each of said phase-shifting networks includes a plurality of capacitance means, and which includes switching means for selectively switching the capacitance means into the respective phase-shifting networks.

13. The combination defined in claim 10 in which each of said direct-current coupling networks includes a gaseous type direct-current coupling tube.

14. An oscillatory system for producing multi-phase output energy including: a plurality of amplifier stages each including an electron discharge tube having a cathode, a control grid and an anode; a corresponding plurality of phase-shifting networks respectively interposed between corresponding ones of said amplifier stages, each of the networks including a cathode follower and each being connected to the anode of the discharge tube in a corresponding one of the amplifier stages and to the control grid of the discharge tube in another of the amplifier stages; a plurality of resistors respectively interposed between the cathodes of the first, second and third discharge tubes and a common floating potential point; a plurality of cathode follower output stages, each including an electron discharge tube having an anode, a control grid and a cathode; and means for coupling the cathode follower in respective ones of the phase-shifting networks to the control grids of respective ones of the discharge tubes in the cathode follower output stages.

15. The combination defined in claim 14 and which includes a plurality of potentiometer means each having an armature and each being interposed between the cathode of a different one of the discharge tubes in the cathode follower output stages and the negative terminal of a source of direct voltage; a plurality of output terminals connected to respective ones of the armatures of said potentiometers; and a plurality of resistance means respectively interposed between different ones of said output terminals and a point of reference potential.

16. The combination defined in claim 14 and which includes a further plurality of electron discharge tubes each having a cathode connected to the anode of a corresponding one of the cathode follower output stages discharge tubes, each having an anode connected to the positive terminal of a source of direct voltage, and each having a control grid; and direct-current feed-back coupling means interposed between the cathode of each of the output stage discharge tubes and the control grid of the corresponding one of the tubes of the further plurality.

17. An oscillatory system for producing multi-phase output energy including: a plurality of amplifier stages each including an electron discharge tube having a cathode, a control grid and an anode; a corresponding plurality of phase-shifting networks respectively interposed between corresponding ones of the amplifier stages, each of the phase-shifting networks including a cathode follower and each being connected to the anode of the discharge tube in a corresponding one of the amplifier stages and to the control grid of the discharge tube in another of the amplifier stages; a plurality of resistance means respectively interposed between the cathodes of the first, second and third discharge tubes and a common floating potential point; a plurality of cathode follower output stages each including an electron discharge tube having an anode, a control grid and a cathode; capacitor means for coupling the cathode followers in respective ones of the phase-shifting networks to the control grid of respective ones of the discharge tubes in the cathode follower stages; a plurality of potentiometer means each having an armature and each being interposed between the cathode of a different one of the discharge tubes in the cathode follower output stages and the negative terminal of a source of direct voltage; a plurality of output terminals connected to respective ones of the armatures of said potentiometers; a plurality of resistance means respectively interposed between different ones of the output terminals and a point of reference potential; a further plurality of electron discharge tubes each having a cathode connected to the anode of a corresponding one of the tubes in the cathode follower output stages, each having an anode connected to the positive terminal of the direct voltage source, and each having a control grid; and direct-current feed-back coupling means interposed between the cathode of each of the output stage discharge tubes and the control grid of the corresponding one of the tubes of the further plurality.

18. An output coupling system including: a plurality of cathode follower stages each including an electron discharge tube having an anode, a control grid and a cathode; input circuit means connected to the control grids of respective ones of the discharge tubes; a plurality of potentiometers, each having an armature and each being interposed between the cathode of a different one of the discharge tubes and the negative terminal of a source of direct voltage; a plurality of output terminals connected to the armatures of respective ones of the potentiometers; a plurality of resistance means respectively interposed between different ones of the output terminals and a point of reference potential; a further plurality of electron discharge tubes each having a cathode connected to the anode of a corresponding one of the cathode follower tubes each having an anode connected to the positive terminal of the direct voltage source, and each having a control grid; and direct-current feed-back coupling means interposed between the cathode of each of the cathode follower tubes and the control grid of the corresponding one of the tubes of the further plurality.

19. A system for producing multi-phase output energy including: a plurality of amplifier stages; a corresponding plurality of electronic discharge means respectively included in said amplifier stages; each of said discharge means including an output electrode, an input electrode and a control electrode; a corresponding plurality of phase-shifting networks coupled to corresponding ones of said amplifier stages and interposed therebetween to sustain oscillation in the system at a frequency established by the parameters thereof, and a corresponding plurality of resistors respectively connected to the input electrodes of respective ones of said discharge means and to a common floating potential point to form a balancing network for the multi-phase output energy.

20. A system for producing multi-phase output energy including: a plurality of amplifier stages; a corresponding plurality of electron discharge tubes included in respective ones of said amplifier stages; each of said tubes including an anode, a cathode and a control grid; a corresponding plurality of phase-shifting networks; each of said phase-shifting networks being coupled to the control grid of a discharge tube in a corresponding one of the amplifier stages; a corresponding plurality of cathode follower stages; a corresponding plurality of further electron discharge tubes included in respective ones of said cathode follower stages; each of said further tubes including an anode, a cathode and a control grid; a corresponding plurality of output terminals respectively connected to the cathodes of respective ones of said further tubes; means for connecting the control grids of respective ones of said further tubes to the anodes of respective ones of said first mentioned tubes; means for respectively connecting the cathodes of said further tubes to respective ones of the phase-shifting networks; and a corresponding plurality of resistors respectively connected to the respective cathodes of said further tubes and to a common floating potential point to form a balancing network for the multi-phase output energy developed at the output terminals.

21. An output coupling system including: a plurality of cathode follower stages each including an electron discharge tube having an anode, a control grid and a cathode; input circuit means connected to the control grids of respective ones of the discharge tubes; means for supplying a direct voltage and having a positive terminal and a negative terminal; a plurality of resistance means respectively connected to the cathodes of different ones of the discharge tubes and to the negative terminal of the supplying means; a plurality of output terminals; means for respectively connecting the output terminals to an intermediate point on respective ones of the resistance means of said plurality; a further plurality of resistance means connected to different ones of the output terminals and to a point of reference potential; a further plurality of electron discharge tubes each having a cathode connected to the anode of a corresponding one of the cathode follower tubes, each having an anode connected to the positive terminal of said direct voltage supplying means and each having a control grid; and direct current feedback coupling means interposed between the cathodes of each of the cathode follower tubes and the control grid of the corresponding one of the tubes of the further plurality.

References Cited in the file of this patent

UNITED STATES PATENTS

| | | |
|---|---|---|
| 2,492,184 | Royden | Dec. 27, 1949 |
| 2,791,694 | Groenindyke | May 7, 1957 |

OTHER REFERENCES

Proc. IRE, vol. 29, No. 2, February 1941, "Phase-Shift Oscillators," Ginzton, pp. 43–49, pages 48.

Electronic Engineering, July 57, "A Very Low Frequency Three-Phase Oscillator," pp. 318–323.

Proc. IRE, vol. 42, No. 4, pp. 677, 680, April 1954, "Ultra-Low Frequency, Three-Phase Oscillator," Smiley.